(12) United States Patent
Choi et al.

(10) Patent No.: US 8,088,262 B2
(45) Date of Patent: Jan. 3, 2012

(54) LOW IMPEDANCE GOLD ELECTRODE, APPARATUS, METHOD AND ELECTROLYTE SOLUTION FOR FABRICATING THE SAME

(75) Inventors: Seh Jin Choi, Seoul (KR); Myung Ki Choi, Seoul (KR)

(73) Assignee: Marveldex, Inc., Seoul (KR)

( * ) Notice: Subject to any disclaimer, the term of this patent is extended or adjusted under 35 U.S.C. 154(b) by 489 days.

(21) Appl. No.: 12/398,340

(22) Filed: Mar. 5, 2009

(65) Prior Publication Data
US 2009/0223816 A1 Sep. 10, 2009

(30) Foreign Application Priority Data
Mar. 5, 2008 (KR) .................. 10-2008-0020576

(51) Int. Cl.
C25B 11/08 (2006.01)
C25B 15/02 (2006.01)
C25C 1/20 (2006.01)

(52) U.S. Cl. ........ 204/292; 204/412; 204/280; 205/350; 205/565; 205/566; 205/568; 205/571

(58) Field of Classification Search .................. 204/412, 204/280, 292; 205/350, 565, 566, 568, 571
See application file for complete search history.

(56) References Cited

U.S. PATENT DOCUMENTS

| 5,468,366 | A | 11/1995 | Wegner et al. |
| 6,706,628 | B2 | 3/2004 | Kim et al. |
| 7,011,981 | B2 | 3/2006 | Kim et al. |
| 2002/0058416 | A1 | 5/2002 | Kim et al. |
| 2004/0157352 | A1 | 8/2004 | Kim et al. |

FOREIGN PATENT DOCUMENTS

| JP | 11-345840 | 12/1999 |
| JP | 3549180 | 8/2004 |
| KR | 10-2002-0037173 | 5/2002 |
| KR | 10-2007-0121980 | 12/2007 |

OTHER PUBLICATIONS

McLaughlin et al. (1996) "Thin Film Flexible Electrodes Based on Gold/Polytetrafluorothylene layers," in; *IEEE Engineering in Medicine and Biology Society.* 18th Annual International Conference, Amsterdam, The Netherlands, Oct. 31-Nov. 3, 1996, pp. 108-109.
International Search Report Corresponding to International Application No. PCT/KR2009/001079, Mailed Aug. 27, 2009.

*Primary Examiner* — Bruce Bell
(74) *Attorney, Agent, or Firm* — Greenlee Sullivan P.C.

(57) ABSTRACT

Provided are a low impedance gold electrode, which has increased surface area, and can improve a bonding force with other materials, an apparatus for and a method of fabricating the low impedance gold electrode, and an electrolyte solution for use in the fabrication of the low impedance gold electrode. The gold electrode has a surface roughness that is increased through electrolysis using an acid electrolyte solution, has an impedance that is less than 1/10 of an impedance before the electrolysis and is higher than 0Ω when the low impedance gold electrode is disposed in the acid electrolyte solution or another electrolyte solution, and has a single-layered structure whose thickness is less than that before the electrolysis.

16 Claims, 14 Drawing Sheets

0sec    1sec

2sec　　　　　　　　5sec

10sec          20sec

50sec  100sec

LOW IMPEDANCE GOLD ELECTRODE, APPARATUS, METHOD AND ELECTROLYTE SOLUTION FOR FABRICATING THE SAME

CROSS-REFERENCE TO RELATED PATENT APPLICATION

This application claims the benefit of Korean Patent Application No. 10-2008-0020576, filed on Mar. 5, 2008, in the Korean Intellectual Property Office, the disclosure of which is hereby incorporated by reference to the extent not inconsistent with the disclosure herewith.

BACKGROUND OF THE INVENTION

1. Field of the Invention

The present invention relates to an electrode and a method of fabricating the same, and more particularly, to a low impedance gold electrode and a method of fabricating the same.

2. Description of the Related Art

An electrical and electronic device, such as a semiconductor device or a micro electro mechanical system (MEMS), has a plurality of electrodes. In general, gold (Au) electrodes are used in those devices as they have improved stability and reduced resistance or impedance.

An electrode, such as an electrode of a biosensor, is generally soaked in an electrolyte solution, and thus a gold electrode is often used in the biosensor in order to improve stability and reduce impedance of the electrolyte solution. However, even though the gold electrode is soaked in the electrolyte solution, an electrical double layer tends to form at an interface between the gold electrode and the electrolyte solution. That double layer impedes the flow of current through the electrolyte solution, thereby resulting in a very high impedance that can be, for example, on the order of tens of kilo-ohms ($k\Omega$) or so.

In general, as the impedance of an electrode decreases, the biosensor is robust with respect to noise. When the electrode is soaked in the electrolyte solution, however, as the surface area of the electrode increases, the number of electrons passing through the electrical double layer increases. Accordingly, the surface area and the impedance of the electrode soaked in the electrolyte solution are inversely related to each other.

There are two methods of increasing the surface area of an electrode, especially, a gold electrode.

The first method is platinum (Pt) plating. The platinum plating involves immersing a gold electrode in a platinum plating solution to coat a surface of the gold electrode with platinum. Thus, the platinum plating increases the surface area of the gold electrode and thus the impedance of the gold electrode is reduced. However, the platinum plating has problems in that the gold electrode coated with platinum is easily damaged due to a weak bonding force and platinum is expensive.

The second method is gold electrode etching in which a surface of a gold electrode is etched with sulfuric acid. The gold electrode etching involves immersing a gold electrode in a sulfuric acid solution and removing a part of the gold electrode. However, the gold electrode etching has problems in that an increased surface area to an original surface ratio is small due to the low reactivity of gold so that the resultant impedance change ratio is also small. For example, it is difficult to even achieve a reduction in the impedance of the gold electrode by half via gold electrode etching. Accordingly, the platinum plating method is generally preferred over the gold electrode etching.

While gold electrodes are often used for electrical and electronic devices, such as semiconductor devices and MEMSs, as described above, the gold electrodes often suffer an additional drawback arising from poor contact problems due to a weak bonding force with other materials.

SUMMARY OF THE INVENTION

The present invention provides, in one aspect, a low impedance gold electrode whose surface area is significantly increased so that the gold electrode has significantly reduced impedance and good durability in an electrolyte, and improves a bonding force with other materials. One advantage of the systems and processes disclosed herein is that the low impedance gold electrodes made by the disclosed process are of relatively low cost. Other aspects of the invention include, but are not limited to, an apparatus for and a method of fabricating the low impedance gold electrode, and an electrolyte solution for use in the fabrication of the low impedance gold electrode.

According to an aspect of the present invention, there is provided a low impedance gold electrode having a surface roughness which is increased through a surface treatment, such as electrolysis using an acid electrolyte solution, having an impedance, which is less than $1/10$ of an impedance before the electrolysis and is higher than $0\Omega$ when the low impedance gold electrode is disposed in the acid electrolyte solution or another electrolyte solution, and having a single-layered structure whose thickness is less than that before the electrolysis is performed.

In another aspect, provided herein is a low impedance gold electrode made by electrolyzing the gold electrode surface in an electrolyte solution, such as an acid electrolyte solution to thereby increase the surface roughness of the electrode compared to the surface roughness of the electrode before it was electrolyzed. The electrolyzing step is further characterized as decreasing the electrode impedance to a value that is less than or equal to $1/10$ of the impedance of the electrode before the electrolyzing step. The electrolyzing step optionally decreases the single-layered structure thickness to a value that is less than the thickness of the single-layered structure before the electrolyzing step. In an embodiment, the thickness is decreased by, on average.

The low impedance gold electrode may have a root-mean-square (RMS) surface roughness after the surface treatment that is selected from a range that is greater than or equal to about 50 nm and less than or equal to about 100 nm.

The low impedance gold electrode may reduce the impedance of the electrolyte solution by preventing the disturbance of a current flow in the electrolyte solution by an electrical double layer that is formed at an interface with the electrolyte solution. The low impedance gold electrode may be used in a device comprising an electrolyte disposed between two electrodes, wherein one or both of the electrodes are a low impedance gold electrode of the present invention. For example, the low impedance gold electrode may be used in a biosensor or a catalyst for an electrochemical reaction device.

Accordingly, provided herein are devices that comprise any of the low impedance gold electrodes disclosed herein. In an embodiment, the low impedance gold electrode corresponds to a device component of the device. In an aspect of this embodiment, the device component of the device includes an electrode of a biosensor or a catalyst in an electrochemical reaction device, for example.

The low impedance gold electrode may be used to improve a bonding force or contact force with other materials or increase the number of materials that can contact the low impedance gold electrode per unit area. For example, the low impedance gold electrode may be used to improve a bonding force with a solder ball during wire bonding, or as source and drain electrodes for an organic thin film transistor (OTFT). Also, the low impedance gold electrode may be used to grow carbon nanotubes (CNTs), such as a higher number CNTs capable of being supported by any of the low impedance gold electrodes disclosed herein compared to conventional gold electrodes.

In another embodiment, the invention is a low impedance gold electrode with a component operably connected to a contact surface of the gold electrode. Contact surface refers to a surface that is physically accessible for physical contact with another component such as, for example, the surface that is in contact with an electrolyte fluid. Examples of components include, for example, a solder ball used for wire bonding or a source or a drain electrode for an organic thin film transistor.

According to another aspect of the present invention, there is provided an apparatus for fabricating a low impedance gold electrode, the apparatus comprising: a 3-electrode system comprising a reference electrode to which a ground voltage is applied, a counter electrode to which a negative (−) voltage is applied, and a working electrode to which a positive (+) voltage is applied, or a 2-electrode electrode system comprising a cathode electrode to which a negative (−) voltage is applied and an anode electrode to which a positive (+) voltage is applied; an acid electrolyte solution contacting the reference electrode and the counter electrode of the 3-electrode system or contacting the cathode electrode of the 2-electrode system; and a gold thin film disposed in the acid electrolyte solution and connected, such as electrically connected, to the working electrode or the anode electrode. In this aspect, a gold electrode is capable of being formed from the gold thin film by application of a voltage to each of the electrodes and performing a surface treatment on the gold thin film.

The reference electrode may be formed of any one material selected from the group consisting of Ag/AgCl, calomel, and $Hg_2So_4$, the counter electrode or the cathode electrode is formed of a transition metal, and the working electrode or the anode electrode is formed of gold (Au). The surface treatment may be a surface treatment using electrolysis which may increase a surface area of the gold thin film by increasing a surface roughness of the gold thin film.

The acid electrolyte solution may contain a transition metal compound. For example, the electrolyte solution may contain $H_2O$, $PtCl_6$, and $Pb(C_2H_3O_2)_2$.

Provided herein are methods of making a low-impedance gold electrode. In an embodiment, a single layer gold structure having an electrode surface and having a first impedance is provided. The electrode surface is electrolyzed in an acid electrolyte solution to increase the surface roughness of the gold electrode compared to the surface roughness before the electrolyzing step, thereby decreasing the impedance of the single layer structure to a second impedance that is less than or equal to $1/10$ of the first impedance. The electrolyzing step decreases the thickness of the single-layered gold structure to a value that is less than the thickness of the single-layered structure before the electrolyzing step.

According to another aspect of the present invention, there is provided a method of fabricating a low impedance gold electrode, the method comprising: providing an apparatus for making a low impedance gold electrode as disclosed herein; applying a ground voltage to the reference electrode, a negative (−) voltage to the counter electrode or the cathode electrode, and a positive (+) voltage to the working electrode or the anode electrode; and performing a surface treatment on the gold thin film by applying a voltage to each of the electrodes for a predetermined period of time, wherein a gold electrode is formed when the gold thin film undergoes the surface treatment.

The predetermined period of time may range from about 0.1 seconds to about 100 seconds. The application of voltage time may further vary depending on the selected voltages as desired. The electrolytic solution may contain 100 ml of $H_2O$, 0.01 g of $PtCl_6$, and 0.01 g of $Pb(C_2H_3O_2)_2$.

According to another aspect of the present invention, there is provided an electrical and electronic device comprising any of the low impedance gold electrodes disclosed herein.

The low impedance gold electrode may be at least one of two electrodes in an electrical and electronic device, wherein an electrolyte solution is disposed between the two electrodes. For example, the electrical and electronic device may be any one selected from the group consisting of a sensor, a cell (e.g., an electrochemical cell or a fuel cell), and an electrochemical reaction device. If the electrical and electronic device is an electrochemical reaction device, the low impedance gold electrode may be used as a catalyst.

The electrical and electronic device may be a semiconductor device or a micro electro mechanical system (MEMS). The electrical and electronic device may be a semiconductor device, wherein the semiconductor device is an organic thin film transistor (OTFT) having an active layer that is an organic semiconductor, wherein the low impedance gold electrode is bonded with the active layer. The electrical and electronic device may comprise a solder ball, wherein the solder ball is bonded with the low impedance gold electrode. The electrical and electronic device may comprise carbon nanotubes (CNTs), wherein the CNTs are grown on or supported by the low impedance gold electrode.

According to another aspect of the present invention, there is provided an electrolyte solution for use in the fabrication of a low impedance gold electrode having a single-layered structure, wherein the electrolyte solution is acid, a surface roughness of the gold electrode is increased by electrolysis using the electrolyte solution, and an impedance of the gold electrode is reduced to less than $1/10$ of an impedance before the electrolysis.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
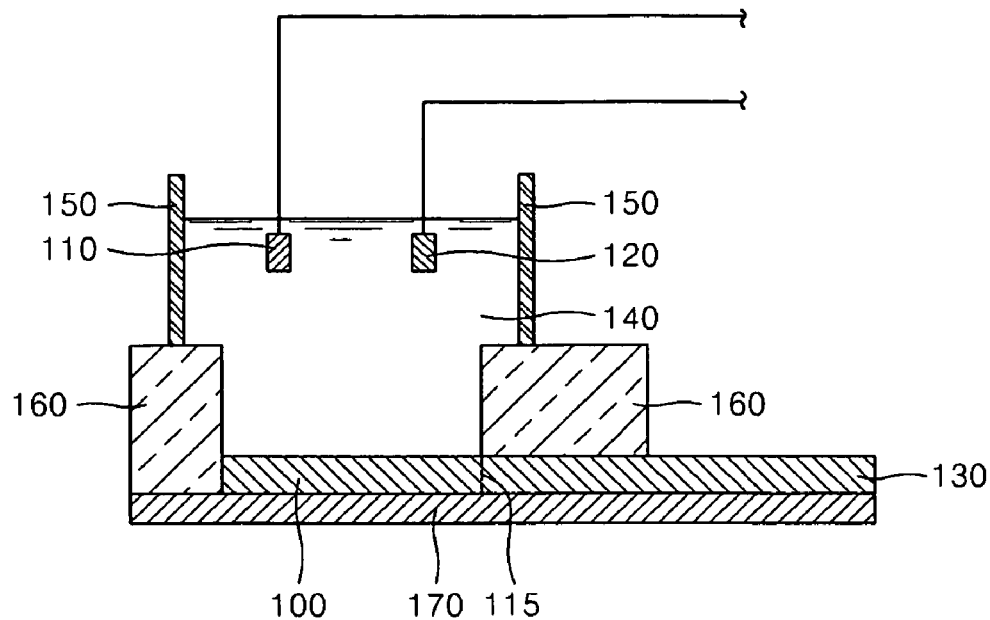
FIGS. 1A and 1B are a cross-sectional view of apparatuses for fabricating a low impedance gold electrode, according to an embodiment of the present invention.

The present invention will now be described more fully with reference to the accompanying drawings, in which exemplary embodiments of the invention are shown. It will be understood that when a layer is referred to as being "on" another layer or a substrate, it can be directly on the other layer or the substrate, or intervening layers may also be present therebetween. In the drawings, the thicknesses or sizes of constituent elements may be exaggerated for clarity, if needed, or sometime the elements may be omitted for a better understanding of the present invention. Like reference numerals refer to like elements throughout. While the present invention has been particularly shown and described with reference to exemplary embodiments thereof using specific terms, the embodiments and terms have been used to explain the present invention and should not be construed as limiting the scope of the present invention defined by the claims.

"Electrically connected" refers to two components that are connected in a manner so that the electric potential of one component affects the electric potential of the other component. In an aspect, electrically connected materials are in physical contact with each other. In an aspect, electrically connected materials are not in direct physical contact with each other, such as when there is an intervening material or layer between the two components. In an aspect, electrically connected materials have regions that are in physical contact and other regions that are not in physical contact with each other.

"Operably connected" refers to a configuration of layers and/or device components of the present invention such that functionality of the components or layers are preserved when connected. Operably connected layers or device components, refers to an arrangement wherein a force or electric charge applied to a layer or device component is transmitted to another layer or device component. Operably connected layers or device components may be in contact, such as layers having internal and/or external surfaces in physical contact. Alternatively, operably connected layers or device components may be connected by one or more connecting layers, such as thin metal layers, reinforcement layers or adhesive layers, positioned between the internal and/or external surfaces of two layers or device components, or that run between two or more layers or components. In an embodiment, a component connected to a low impedance gold electrode contact surface is "operably connected" such that the electrode and component functionality are preserved.

"Single-layer" refers to a layer of gold without any other layers interposed between the single-layer and surrounding electrolyte. In an aspect, the single layer at least partially covers another material, such as a non-gold material or a gold material having lower purity or is an alloy of thereof.

FIG. 1A is a cross-sectional view of a 3-electrode system apparatus for fabricating a low impedance gold electrode, according to an embodiment of the present invention.

Referring to FIG. 1A, the apparatus includes a thin gold film 100, a reference electrode 110, a counter electrode 120, a working electrode 130 an electrolyte solution 140, an electrolyte solution fence 150, a passivation layer 160, and a glass wafer 170.

A ground voltage is applied to the reference electrode 110, a negative (−) voltage is applied to the counter electrode 120, and a positive (+) voltage is applied to the working electrode 130. The working electrode 130 is connected to the thin gold film 100 that will undergo a surface treatment using electrolysis. In this aspect, connected refers to the electrode 130 and gold film 100 being electrically connected with each other such that a change in electric potential in one effects a change in the electric potential of the other. A constant current flows between the counter electrode 120 and the working electrode 130.

The reference electrode 110, the counter electrode 120, and the working electrode 130 may be formed of any specific materials suitable for the electrolysis to be performed on the thin gold film 100. For example, the reference electrode 110 may be formed of any one of Ag/AgCl, calomel (e.g., $Hg_2Cl_2$), and $Hg_2SO_4$. The counter electrode 120 may be formed of a transition metal. The working electrode 130 may be formed of gold (Au), like the thin gold film 100, which at least partially covers the working electrode 130. In an aspect, the thin gold film is an integral portion of the working electrode. In an aspect, the thin gold film is compositionally different than the counter electrode. The transition metal for forming the counter electrode 120 may be platinum (Pt).

The electrolyte solution 140, which is an acid solution for an electrolysis reaction of the thin gold film 100, contains a transition metal compound. For example, the electrolyte solution 140 may contain $H_2O$, $PtCl_6$, and $Pb(C_2H_3O_2)_2$. Quantitatively, the electrolyte solution 140 may contain 100 ml of $H_2O$, 0.01 g of $PtCl_6$, and 0.01 g of $Pb(C_2H_3O_2)_2$. The electrolyte solution fence 150 and the passivation layer 160 block the electrolyte solution 140 from the outside of the apparatus. The transition metal compound functions as a catalyst.

The thin gold film 100 is disposed on the glass wafer 170 under the electrolyte solution 140, and is connected to the working electrode 130. Although the thin gold film 100 and the working electrode 130 are showed as distinguished by a dotted line 115 from each other in FIG. 1, at least a part of an integrated gold thin film which is exposed to the electrolyte solution 140 is the thin gold film 100 and a part of the integrated gold thin film which extends from the thin gold film 100 and is disposed under the passivation layer 160 is the working electrode 130. In this example, where part of the working electrode 130 is part of the gold thin film 100, the gold thin film 100 is referred to as "integrated" with the working electrode 130.

Although the thin gold film 100 is disposed under the electrolyte solution 140 in FIG. 1A, the present invention is not limited thereto and the thin gold film 100 may be disposed in various positions. For example, as long as the thin gold film 100 is electrically connected to the working electrode 130, the thin gold film 100 may be disposed on the electrolyte solution fence 150 or may be suspended in the middle of the electrolyte solution 140. If the thin gold film 100 is suspended in the middle of the electrolyte solution 140, a material for forming the thin gold film 100 may have a different geometry besides that of a thin film, such as a rod shape, for example.

The passivation layer 160 helps confine and store the electrolyte solution 140 and also defines the thin gold film 100 that will undergo electrolysis in the integrated gold thin film. Accordingly, the passivation layer 160 is optionally formed of an insulating material.

Although the apparatus is schematically illustrated in FIG. 1A, the present invention is not limited thereto and the apparatus may have various other structures as long as the composition of the electrolyte solution and the applied voltages are the same. For example, the glass wafer 170, the electrolyte solution fence 140, and the passivation layer 160 may have various structures or formed of various materials.

Although the apparatus of FIG. 1A is a 3-electrode system including the reference electrode 110, the counter electrode 120, and the working electrode 130, the 3-electrode system of FIG. 1A may be replaced by a 2-electrode system including a cathode electrode and an anode electrode.

Figure 1B:
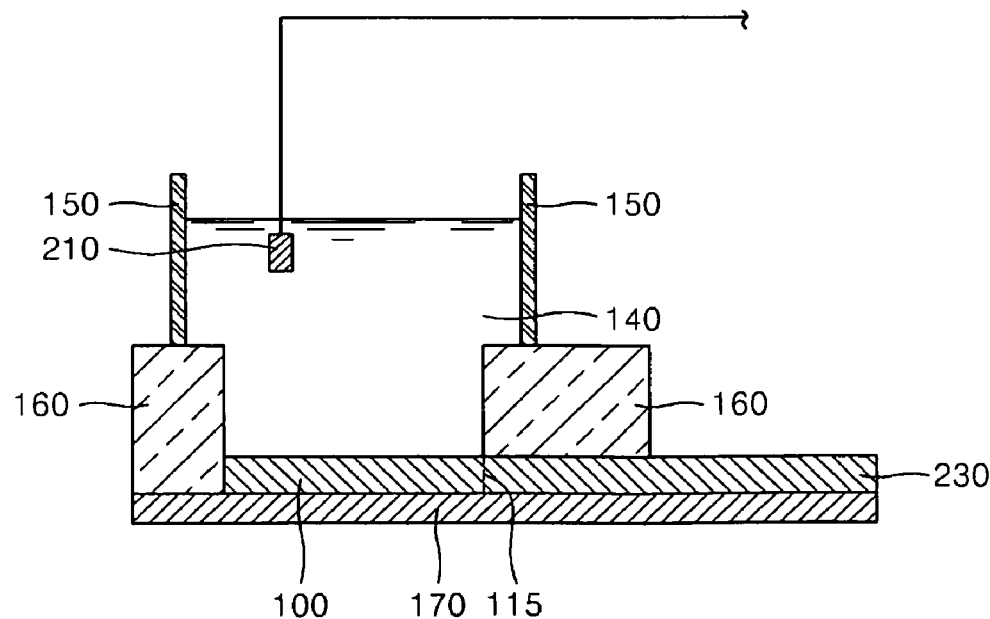

FIG. 1B is a cross-sectional view of an apparatus that is a 2-electrode system for fabricating a low impedance gold electrode, according to an embodiment of the present invention.

Referring to FIG. 1B, the apparatus includes two electrodes instead of three electrodes, that is the cathode electrode 210 to which a negative (−) voltage is applied contacts the electrolyte solution 140, and the anode electrode 230 to which a positive (+) voltage is applied is connected to the thin gold film 100 like the working electrode 130. The cathode electrode 210 may be formed of the same material as that of the counter electrode 120, and the anode electrode 230 may be formed of the same material as that of the working electrode 130.

The apparatuses of FIGS. 1A and 1B constructed as described above may be used to increase surface roughness and surface area of the thin gold film 100. In this use the impedance of the thin gold film 100 may be significantly reduced by performing electrolysis on a surface of the metal thin film 100. In an aspect, the electrolysis step is performed for a predetermined period of time, for example, 1 to 100 seconds. The increase in the surface roughness and the reduction in the impedance of the gold thin film 100 by electrolysis is further explained with reference to FIGS. 2A through 3B.

FIGS. 2A through 2D are atomic force microscope (AFM) photographs illustrating that the surface roughness of a gold thin film is increases with electrolysis time as performed by the apparatus of FIG. 1. The upper photographs illustrate a surface of the gold thin film, and the lower photographs illustrate a three-dimensional image of the gold thin film scanned by an AFM. The units of the X and Y axes are in μm, and the unit of the Z axis is nm. The Z axis is scaled up relative to the X and Y axes. That is, the Z axis is exaggerated in order to clearly show the increase in the surface roughness.

Figure 2A:
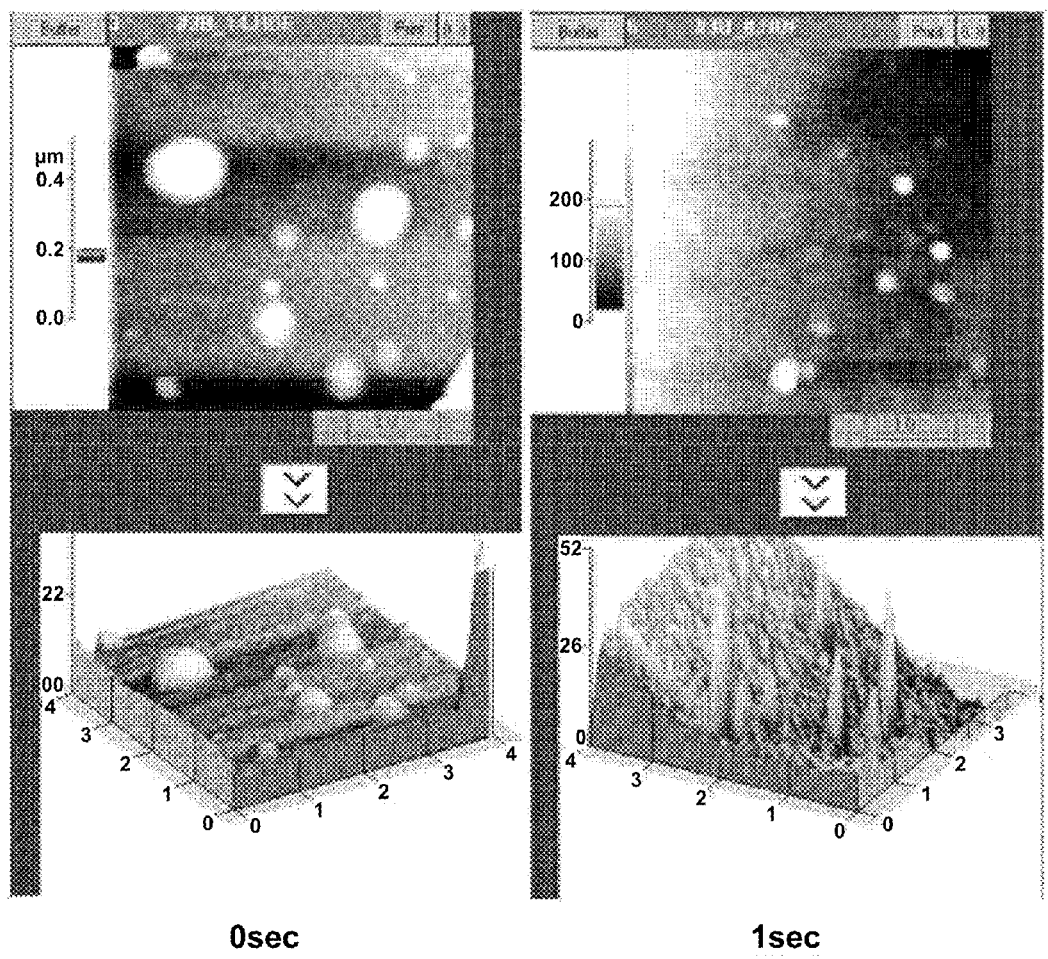
FIGS. 2A through 2D are atomic force microscope (AFM) photographs illustrating that the surface roughness of a gold thin film is increased over time due to electrolysis performed using the apparatus of FIG. 1.
Figure 2A:
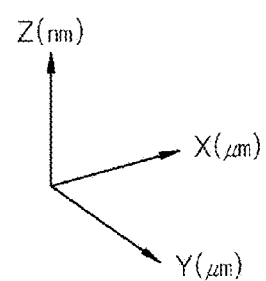

The left photographs of FIG. 2A illustrate the surface of the gold thin film and the three-dimensional image of the gold thin film before electrolysis, and the right photographs illustrate the surface of the gold thin film and the three-dimensional image 1 second after electrolysis. As shown in FIG. 2A, the surface roughness of the gold thin film 100 significantly increases 1 second after the electrolysis.

Figure 2B:
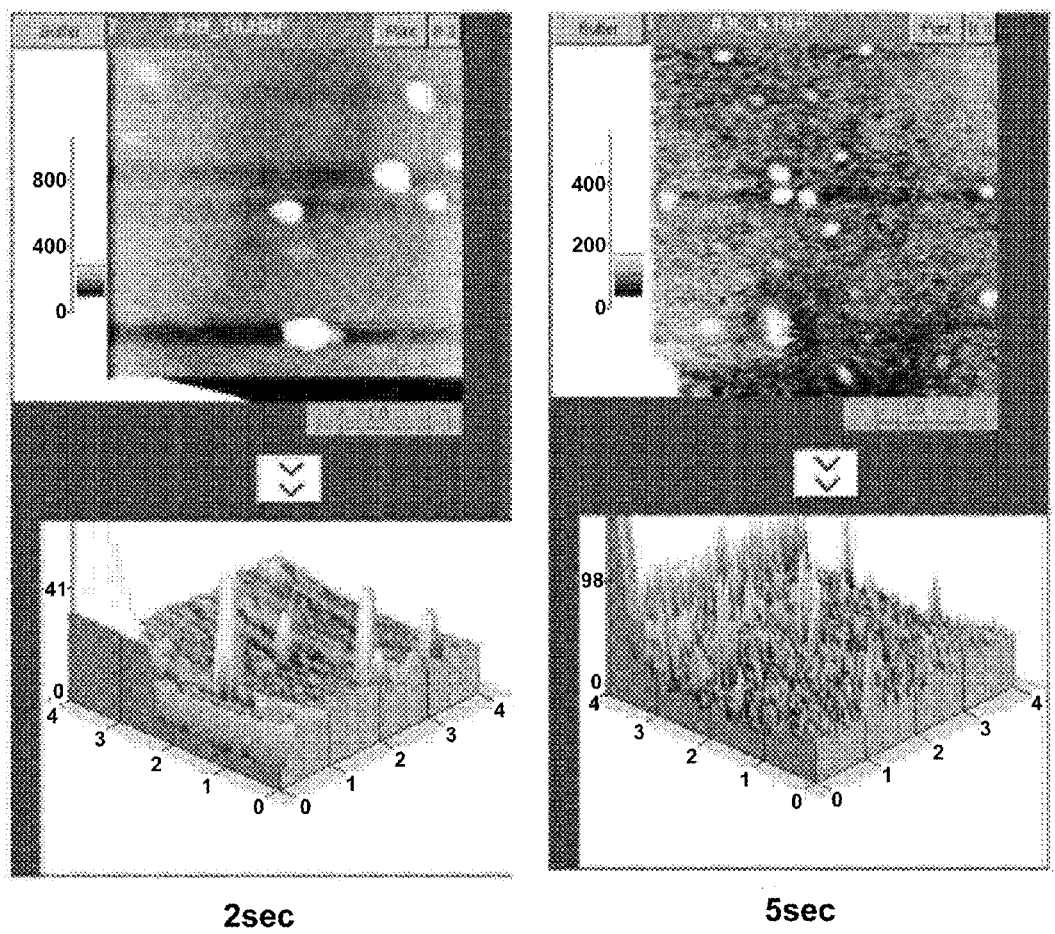
Figure 2B:
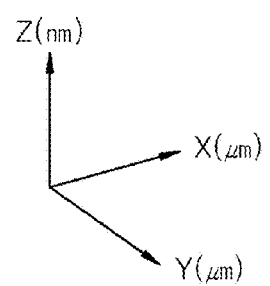
Figure 2C:
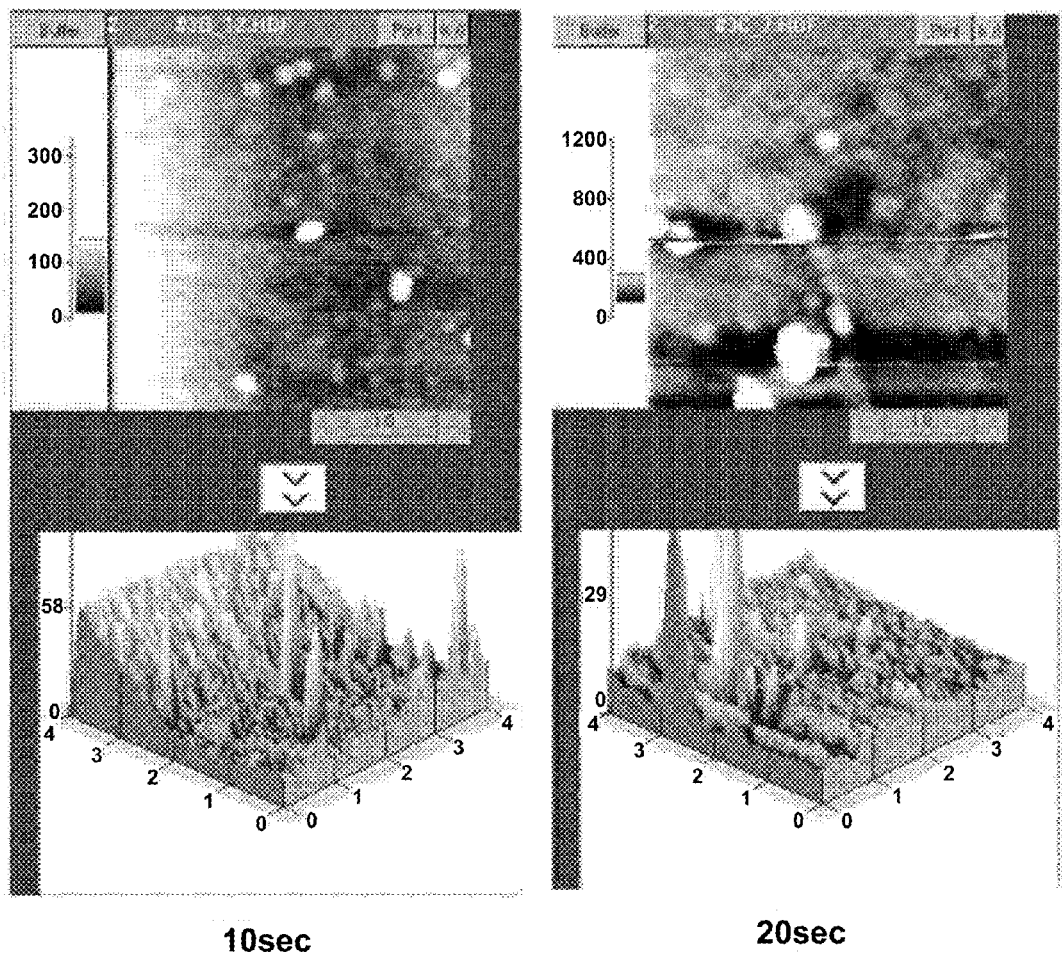
Figure 2C:
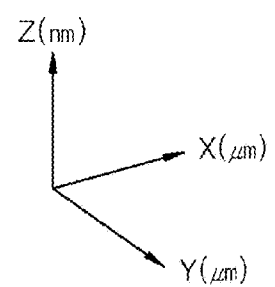
Figure 2D:
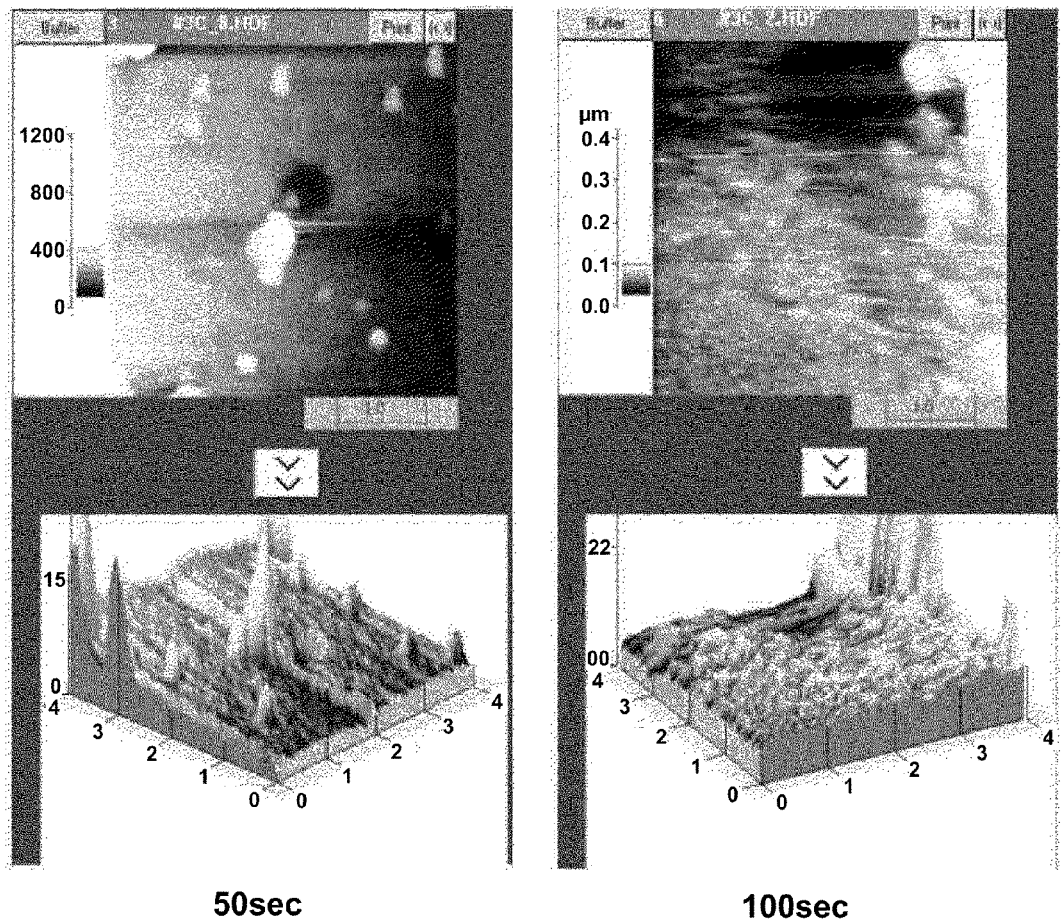
Figure 2D:
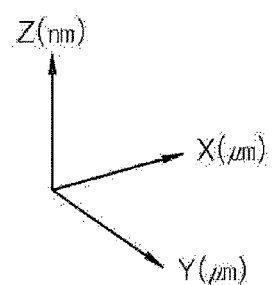

The left photographs of FIG. 2B are photographs taken 2 seconds after electrolysis, the right photographs of FIG. 2B are photographs taken 5 seconds after the electrolysis, the left photographs of FIG. 2C are photographs taken 10 seconds after the electrolysis, and the right photographs of FIG. 2C are photographs taken 20 seconds after the electrolysis, and the left photographs of FIG. 2D are photographs taken 50 seconds after the electrolysis, and the right photographs of FIG. 2D are photographs taken 100 seconds after the electrolysis. FIGS. 2A through 2D indicate that the thickness of the gold thin film decreases with time of electrolysis, and the surface roughness 1 second after the electrolysis is almost similar to the surface roughness at 2, 5, 10, 20, 50, and 100 seconds of electrolysis (see FIG. 4). Accordingly, for applications requiring a thinner gold electrode, the electrolysis may be performed longer. For applications where a desired gold electrode impedance is required, the electrolysis may be performed for only 1 second, or less.

Figure 3A:
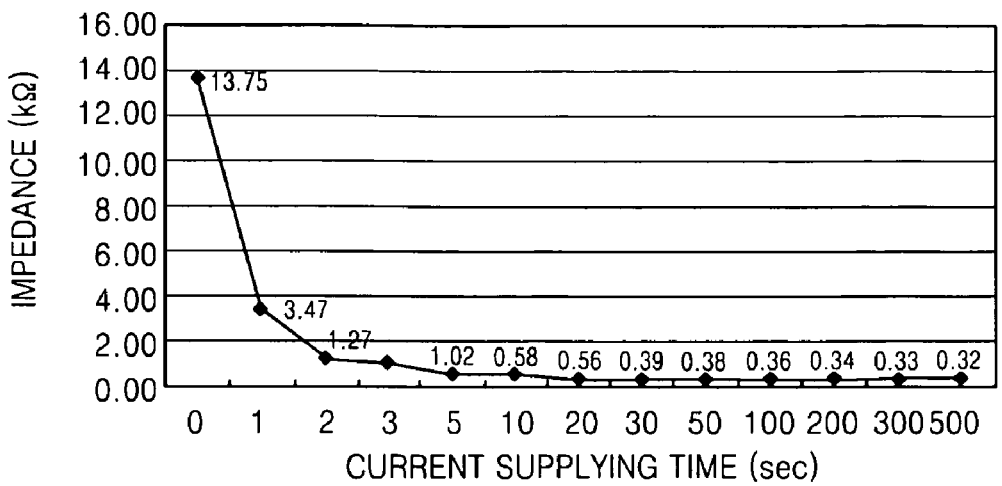
FIG. 3A is a graph illustrating that the impedance of a gold thin film is reduced by conventional platinum plating.

FIG. 3A is a graph illustrating that the impedance of a gold thin film is reduced due to conventional platinum plating. The X axis represents time in units of seconds (sec) for supplying current, and the Y axis represents the impedance of the gold thin film measured in an electrolyte solution in units of kilo-ohms kΩ. A current of approximately 270 μA flows from a counter electrode to a working electrode.

Referring to FIG. 3A, the impedance of the gold thin film 2 seconds after the conventional platinum plating is less than 1/10 of the impedance of the gold thin film before the conventional platinum plating, and the impedance of the gold thin film is gradually reduced as the current is continuously supplied. However, conventional platinum plating suffers from disadvantages including the gold thin film being easily damaged due to the weak bonding force of platinum as described in the related art.

Figure 3B:
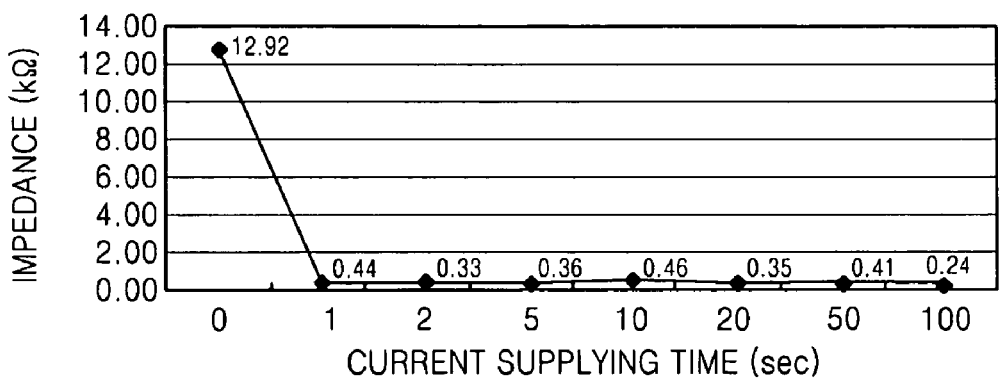
FIG. 3B is a graph illustrating that the impedance of a gold thin film is reduced by electrolysis according to the present invention.

FIG. 3B is a graph illustrating that the impedance of a gold thin film is reduced due to electrolysis according to the present invention. The X axis represents time in units of seconds (sec) for supplying a current, and the Y axis represents the impedance of the gold thin film measured in an electrolyte solution in units of kilo-ohms (kΩ). A current of approximately 270 μA flows from a working electrode to a counter electrode, unlike in conventional platinum plating.

Referring to FIG. 3B, the impedance of the gold thin film 1 second after the electrolysis is about 1/30 of the impedance of the gold thin film before the electrolysis, but thereafter, the impedance of the gold thin film remains almost constant with additional electrolysis time. The result of FIG. 3B and the result of FIGS. 2A through 2D are identical to each other in that a surface roughness is kept almost constant after about one second of electrolysis, irrespective of additional electrolysis time.

A gold electrode obtained by the electrolysis process disclosed herein has an impedance as low as the impedance of a gold electrode obtained by conventional platinum plating, and more surprisingly, can reach a desired impedance in an electrolysis time that is as short as 1 second. As will be described later with reference to FIGS. 5A through 6B, the gold electrode obtained by the electrolysis according to the present invention has better durability than the gold electrode obtained by conventional platinum plating. That is, the gold electrode obtained by the electrolysis according to the present invention is not deformed or damaged by an external impact.

The reason why the gold electrode obtained by the electrolysis according to the present invention has such a low impedance is that a surface roughness is increased, thereby increasing the electrode surface area, and thus the number of electrons passing through an electrical double layer is increased. In addition, as the surface roughness increases, the disturbance of the flow of current by the electrical double layer is minimized or prevented.

Figure 4:
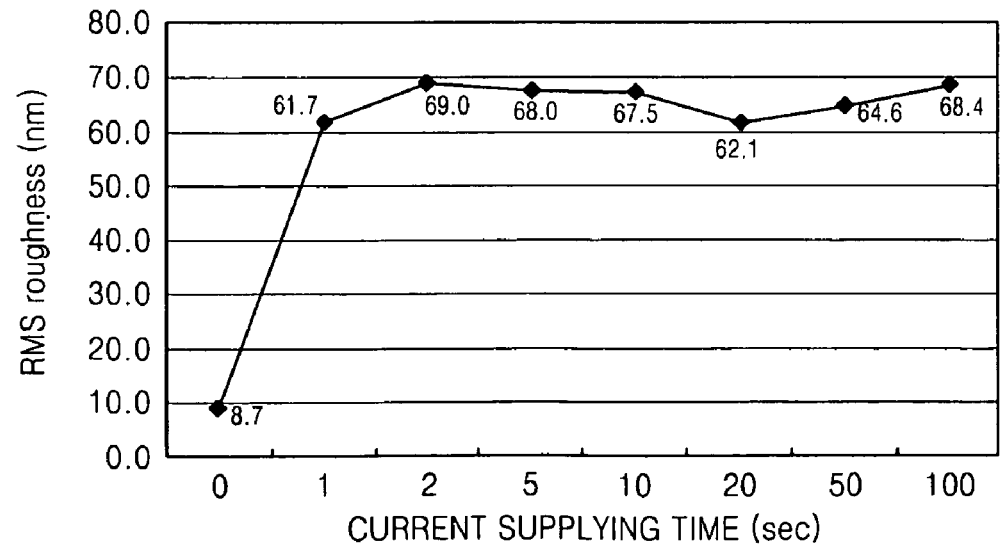
FIG. 4 is a graph illustrating that the surface roughness of a gold thin film is increased over time due to electrolysis performed according to the present invention.

FIG. 4 is a graph illustrating that the surface roughness of a gold thin film increases with electrolysis time.

FIG. 4 is a graph illustrating the root-mean-square (RMS) surface roughness of a low impedance gold electrode as a function of electrolysis time. The X axis represents time in units of seconds (sec) for supplying a current, and the Y axis represents a surface roughness (expressed in terms of RMS) in units of nanometers (nm).

Referring to FIG. 4, the surface roughness of the gold thin film increases from less than 10.0 nm before the electrolysis to more than 60.0 nm after only 1 second of electrolysis, which is more than a factor of 5 times higher than an initial surface roughness of 10.0 nm. Also, the surface roughness remains essentially constant thereafter. The result of FIG. 4 and the result of FIG. 3B are identical to each other in that an impedance remains almost constant in time after 1 second is passed. Hence, it is found that an increase in a surface roughness is an important factor in a decrease in impedance of a thin gold film associated with the electrolysis processes disclosed herein.

Figure 5:
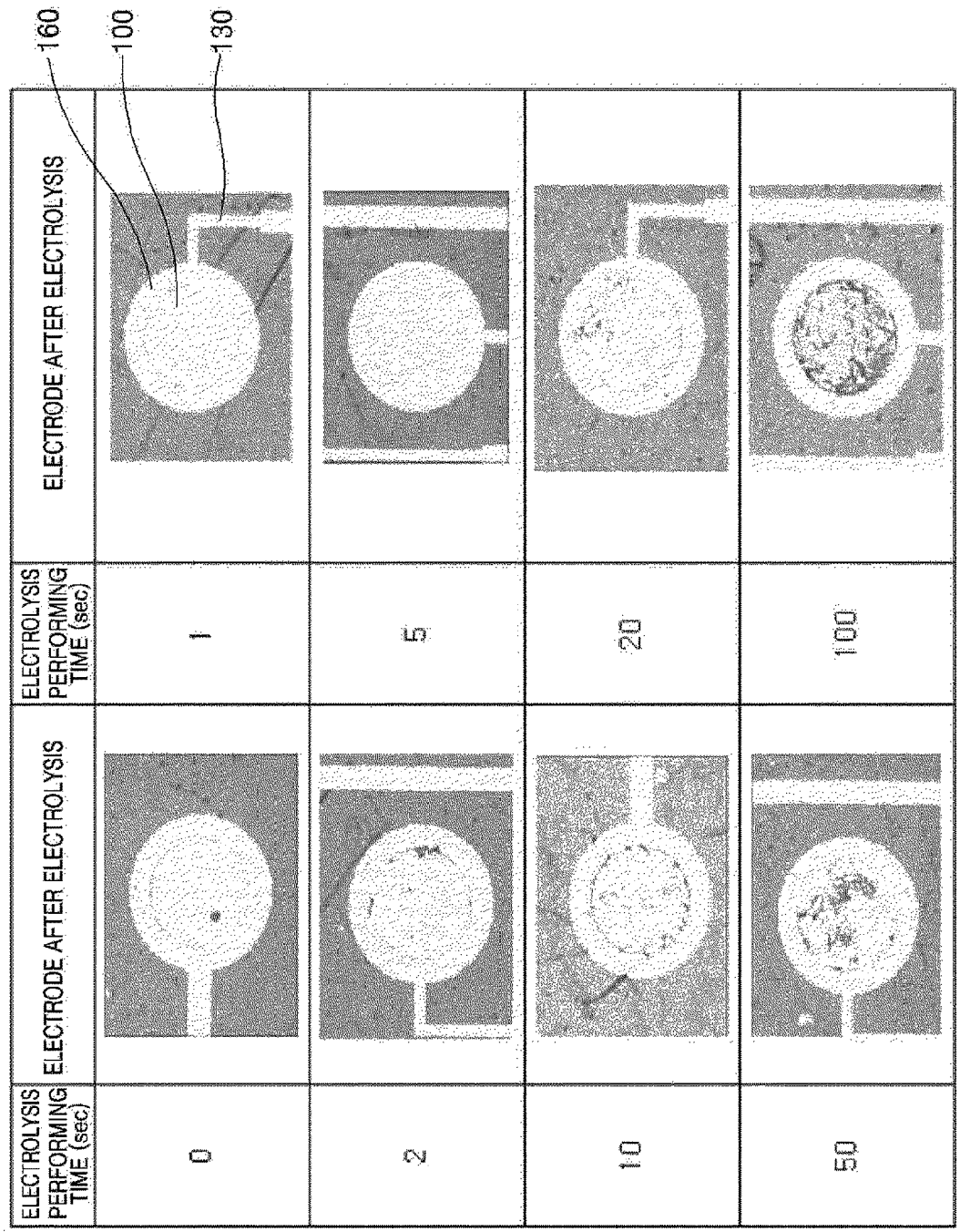
FIG. 5 are photographs of a gold thin film of the apparatus of FIG. 1 undergoing electrolysis over time.

FIG. 5 illustrates the gold thin film 100 of the apparatus of FIG. 1 undergoing electrolysis over time.

Referring to FIG. 5, in time, the thickness of the god thin film 100 defined by the edge of the passivation layer 160 is reduced. 100 seconds after the electrolysis (see bottom right panel), the thickness of the gold thin film 100 is reduced to the extent that the gold thin film 100 is nearly transparent. The working electrode 130 is connected to the gold thin film 100.

Figure 6A:
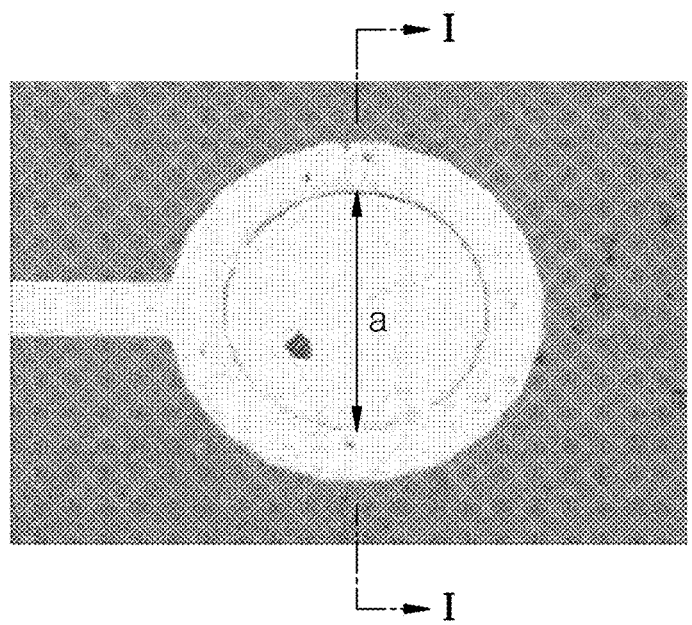
FIG. 6A is a photograph of a gold thin film on a wafer before electrolysis.
Figure 6B:
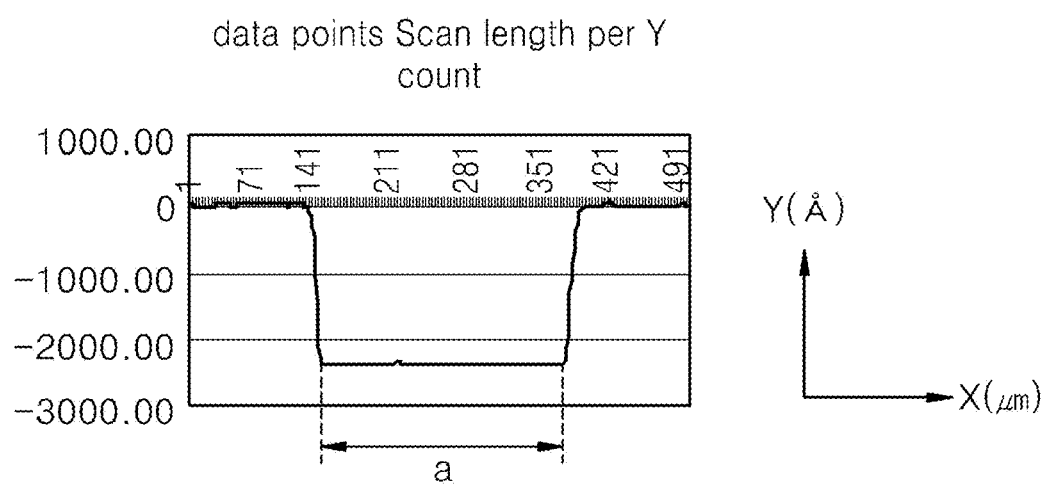
FIG. 6B is a test graph obtained by indirectly measuring the strength of the gold thin film through line I-I' of FIG. 6A by using alpha-step equipment.

FIG. 6A is a photograph of a gold thin film on a wafer before electrolysis. FIG. 6B is a test graph obtained by indirectly measuring the strength of the gold thin film through line I-I' of FIG. 6A by using alpha-step equipment. The unit of the Y axis is Angstroms (Å), the unit of the X axis is µm, and a vertical force is approximately 16.8 mg weight.

The alpha-step equipment, which is a device developed to measure the step profile and thickness of a thin film with a stepped portion disposed on a surface of a wafer, senses a pressure gradient resulting from the stepped portion by scanning a tip over the surface of the wafer to measure the thickness of the stepped portion. The alpha-step equipment measures the thickness of the thin film disposed on the wafer by applying a force ranging from a lower limit of 0.1 mg weight to an upper limit of 16.8 mg weight. A gold electrode obtained by conventional platinum plating is seriously damaged occasionally even when such alpha-step equipment measures the thickness of a stepped portion by applying the lower limit force of 0.1 mg weight.

FIG. 6B is a test graph obtained by measuring a stepped portion of the gold thin film before the electrolysis by using the alpha-step equipment. The result of FIG. 6B is used as a comparative criterion against the result obtained after measuring the stepped portion of the gold thin film after the electrolysis by using the alpha-step equipment.

Figure 6C:
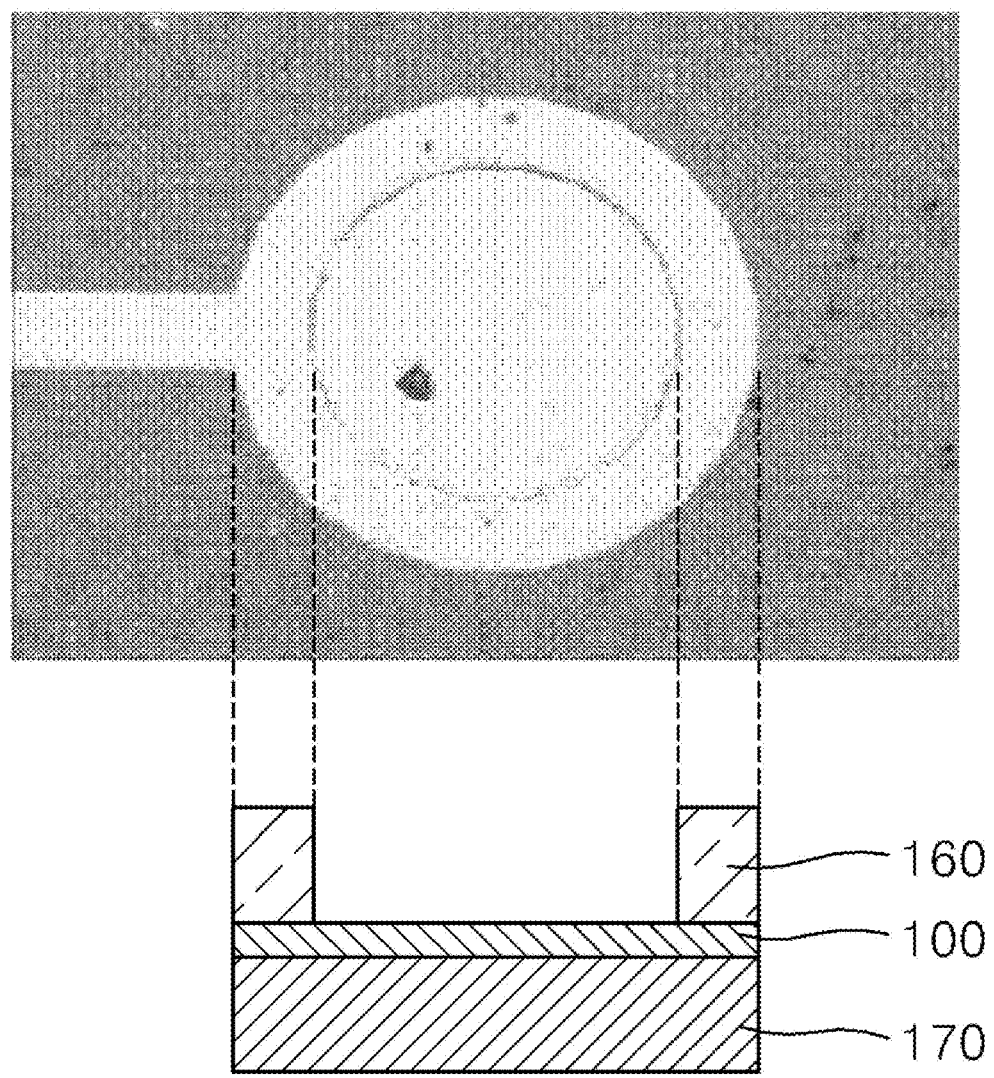
FIG. 6C is a cross-sectional view of the photograph of FIG. 6A.

FIG. 6C illustrates a cross-sectional view of the photograph of FIG. 6A. As apparent, the cross-sectional view of FIG. 6C is almost consistent with a solid line of the test graph of FIG. 6B which is obtained by measuring the stepped portion by using the alpha-step equipment.

Figure 7A:
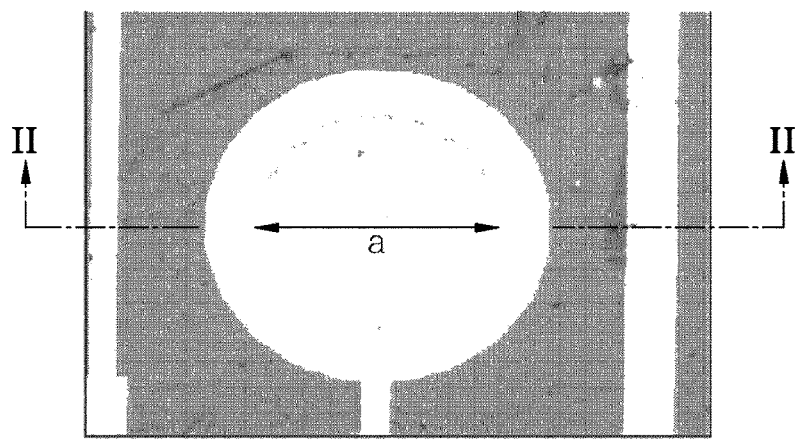
FIG. 7A is a photograph of a gold thin film on a wafer after electrolysis according to the present invention.
Figure 7B:
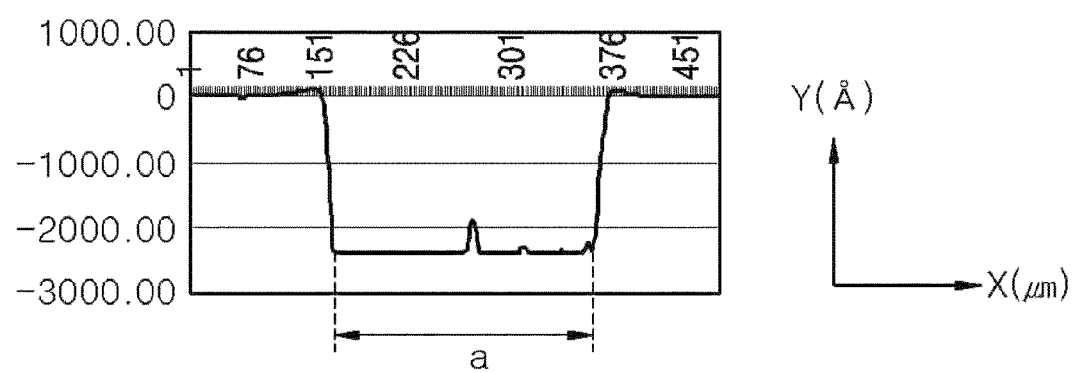
FIG. 7B is a test graph obtained by indirectly measuring the strength of the gold thin film through line II-II' of FIG. 7A by using alpha-step equipment.

FIG. 7A is a photograph of a gold thin film on a wafer after electrolysis according to the present invention. FIG. 7B is a test graph obtained by measuring the strength of the gold thin film through line II-II' of FIG. 7A by using the alpha-step equipment. The unit of the Y axis is Angstroms, the unit of the X axis is µm, and a vertical force is approximately 16.8 mg weight.

Referring to FIG. 7B, the result of FIG. 7B which is obtained by measuring the stepped portion of the gold thin film disposed on the wafer after the electrolysis by using alpha-step equipment is identical to the result of FIG. 6B which is obtained by measuring the stepped portion of the gold thin film before the electrolysis. Accordingly, since a gold electrode obtained by the electrolysis according to the present invention is not deformed despite the measurement of the stepped portion by the alpha-step equipment, it is inferred that the gold electrode obtained by the electrolysis according to the present invention has good durability. That is, the gold electrode obtained by conventional platinum plating is damaged even when the strength of the gold electrode is measured by applying a force of 0.1 mg weight, whereas the gold electrode obtained by the electrolysis according to the present invention is not damaged even when the strength of the gold electrode is measured by applying the upper limit of the device's force (e.g., 16.8 mg weight).

Accordingly, the gold electrode obtained by the electrolysis according to the present invention can be used as a stable electrode for various electrical and electronic devices, such as a biosensor, a cell, and an electrochemical device. Also, since the gold electrode obtained by the electrolysis according to the present invention can have an impedance as low as or lower than the impedance of a gold electrode obtained by conventional platinum plating, and can be easily fabricated at low cost, manufacturing costs of an electrical and electronic device including the gold electrode can be significantly reduced without any adverse impact on device performance.

In a chemical reaction, as the catalyst surface area accessible to the reagent increases, the function of a catalyst can be more efficiently performed. Accordingly, since surface area increases by increase in the surface roughness due to the electrolysis process provided herein, the gold electrode with low impedance obtained by the electrolysis according to the present invention can also efficiently function as a catalyst. In an aspect, the invention provides catalysts FIG. 8 is a cross-sectional view of a fuel cell including a low impedance gold electrode, according to an embodiment of the present invention.

Figure 8:
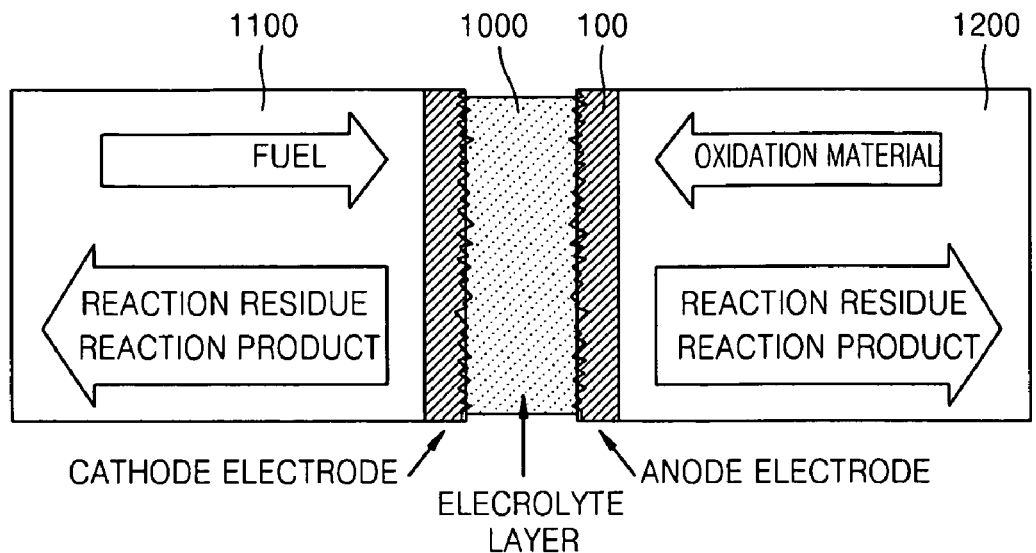
FIG. 8 is a cross-sectional view of a fuel cell including a low impedance gold electrode, according to an embodiment of the present invention.

Referring to FIG. 8, the fuel cell includes an electrolyte layer 1000, low impedance gold electrodes 100 optionally formed on both sides of the electrolyte layer 1000, a fuel supply unit 1100 supplying a fuel to the low impedance gold electrodes 100, and an oxidation material supply unit 1200 supplying an oxidation material to the low impedance gold electrodes 100.

The low impedance gold electrodes 100, a surface roughness of each of which is increased through electrolysis, can reduce an impedance by reducing the disturbance of the flow of current by an electrical double layer formed at an electrode/electrolyte interface as described above. The fuel supply unit 1100 and the oxidation material supply unit 1200 transmit reaction products, which are produced through a chemical reaction between the electrolyte layer 1000 and the low impedance gold electrodes 100, in a direction opposite to a direction in which the fuel and the oxidation material are supplied.

Since the fuel cell of FIG. 8 has a low impedance, the fuel cell can efficiently generate current, and thus heat-related problems that appear in conventional fuel cells are minimized or avoided.

Figure 9:
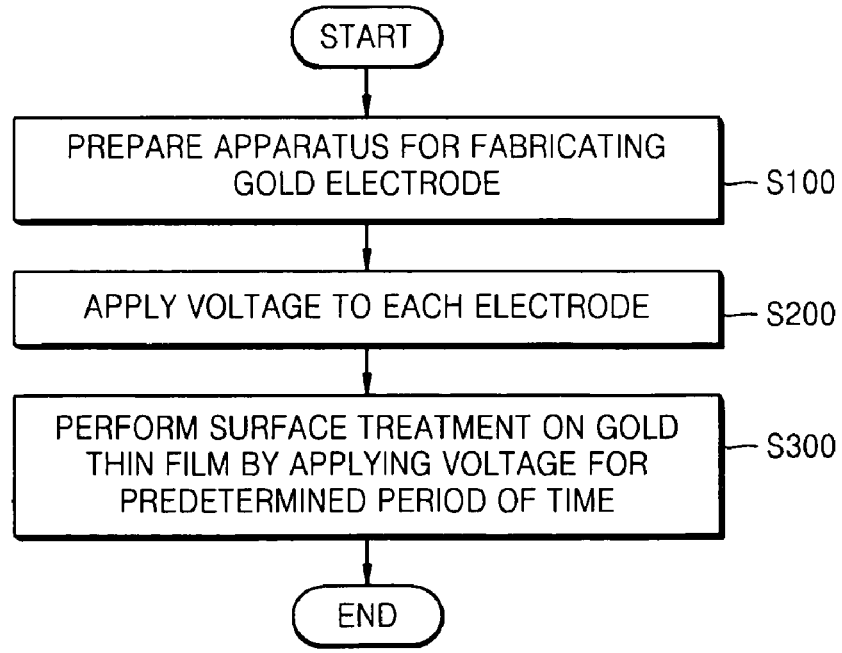
FIG. 9 is a flowchart illustrating a method of fabricating a low impedance gold electrode, according to an embodiment of the present invention.

FIG. 9 is a flowchart illustrating one method for fabricating a low impedance gold electrode, according to an embodiment of the present invention. For convenience, the method summarized in FIG. 9 is explained with reference to FIG. 1, although the method is applicable for other systems, such as two-electrode systems, for example.

Referring to FIG. 9, in order to fabricate a gold electrode, in operation S100, an apparatus for fabricating a gold electrode such as the apparatus of FIG. 1 is prepared. In operation S200, a voltage is applied to each of the reference electrode 110, the counter electrode 120, and the working electrode 130. That is, a ground voltage is applied to the reference electrode 110, a negative (−) voltage is applied to the counter electrode 120, and a positive voltage (+) voltage is applied to the working electrode 130. In this example, a current applied via the working electrode 130 is about 270 μA.

In operation S300, a surface treatment, that is, electrolysis, is performed on the thin gold film 100 by applying the above-referenced voltages for a predetermined period of time. The predetermined period of time may be arbitrarily selected between about 1 second to about 100 seconds according to a desired thickness of the gold electrode, and a constant current flows between the working electrode 130 and the counter electrode 120 for the predetermined period of time. The predetermined period of time is not limited to 1 second to 100 seconds, but is of any time to provide a desired surface roughness, such as a RMS surface roughness that is selected from a desired range. For example, the surface roughness of the thin gold film may be increased by applying a voltage for a short period of time, for example, 0.1 seconds.

The gold electrode according to the present invention has been explained in terms of reducing the impedance thereof. However, the gold electrode according to the present invention can be characterized by other parameters besides low impedance. Other parameters used to characterize the gold electrode according to the present invention are explained herein.

Figure 10A:
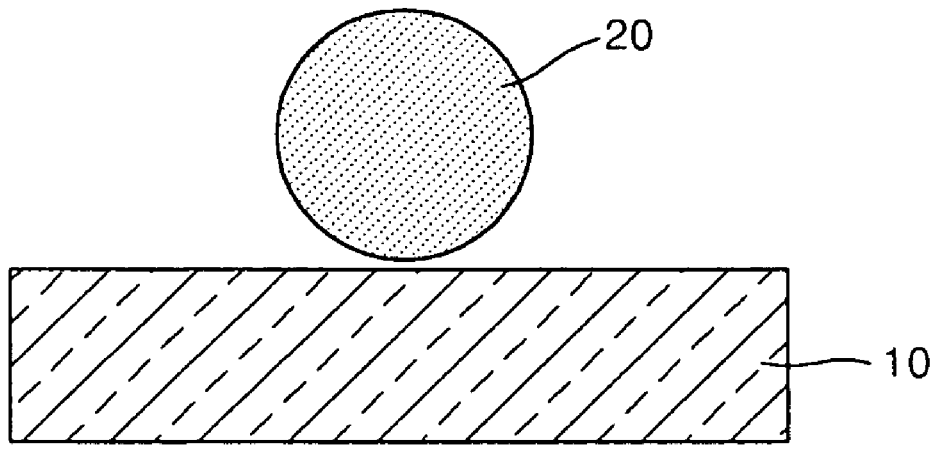
FIGS. 10A and 10B are cross-sectional views illustrating a case where a solder ball is bonded with a conventional gold electrode.
Figure 10B:
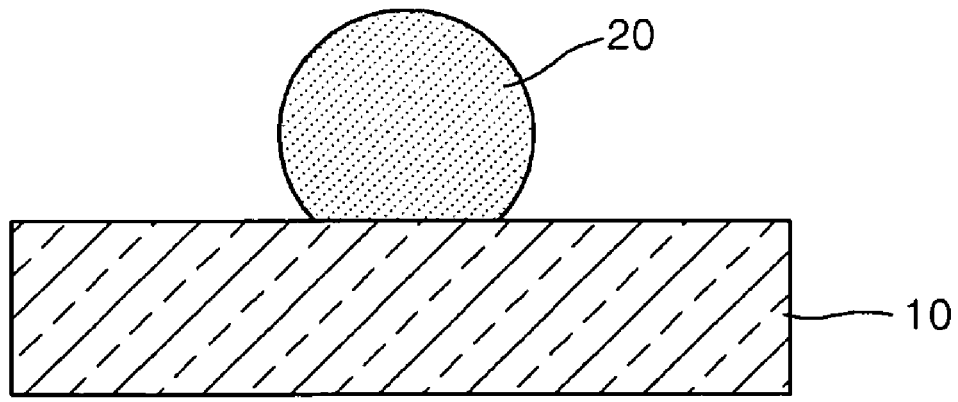

FIGS. 10A and 10B are cross-sectional views illustrating an embodiment where a solder ball 20 is bonded with a conventional gold electrode 10.

Referring to FIGS. 10A and 10B, the conventional gold electrode 10, which is often used in a semiconductor device, is bonded with the solder ball 20. However, since a surface of the conventional gold electrode 10 is smooth and the solder ball 20 has a weak bonding force, the solder ball 20 is occasionally separated from the conventional gold electrode 10 when the semiconductor device is used, resulting in contact failure and semiconductor device malfunction. Accordingly, there is a demand for a method of improving a bonding force between the solder ball 20 and the conventional gold electrode 10

Figure 11A:
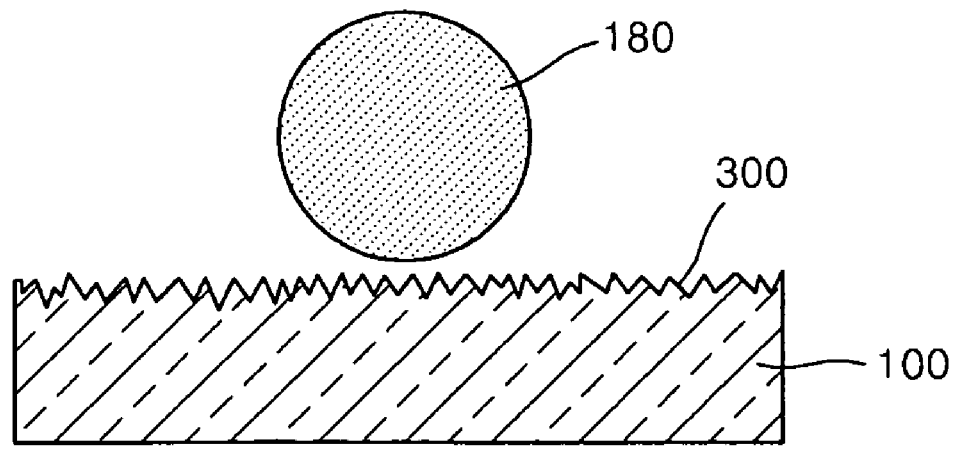
FIGS. 11A and 11B are cross-sectional views illustrating a case where a solder ball is bonded with a low impedance gold electrode according to the present invention.
Figure 11B:
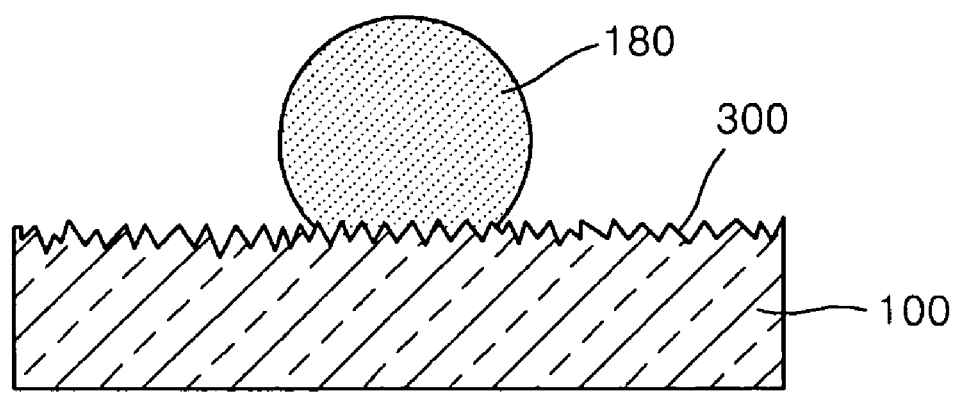

FIGS. 11A and 11B are cross-sectional views illustrating a case where a component that is a solder ball 180 is bonded with a low impedance gold electrode 100 according to the present invention.

Referring to FIGS. 11A and 11B, the gold electrode 100 whose surface roughness is improved through electrolysis (as illustrated by the jagged surfaces) can overcome poor contact problems resulting from the weak bonding force between the solder ball 20 and the conventional gold electrode 10. That is, when the gold electrode 100 obtained by the electrolysis, and particularly the contact surface 300 corresponding, according to the present invention is bonded with the solder ball 180, since a surface roughness of the gold electrode 100 is increased and a contact area between the gold electrode 100 and the solder ball 180 is increased, the resultant bonding force between the solder ball and the electrode surface is greatly increased. As a result, poor contact problems between the gold electrode 100 and the solder ball 180 are avoided or minimized by the methods and systems disclosed herein.

Figure 12:
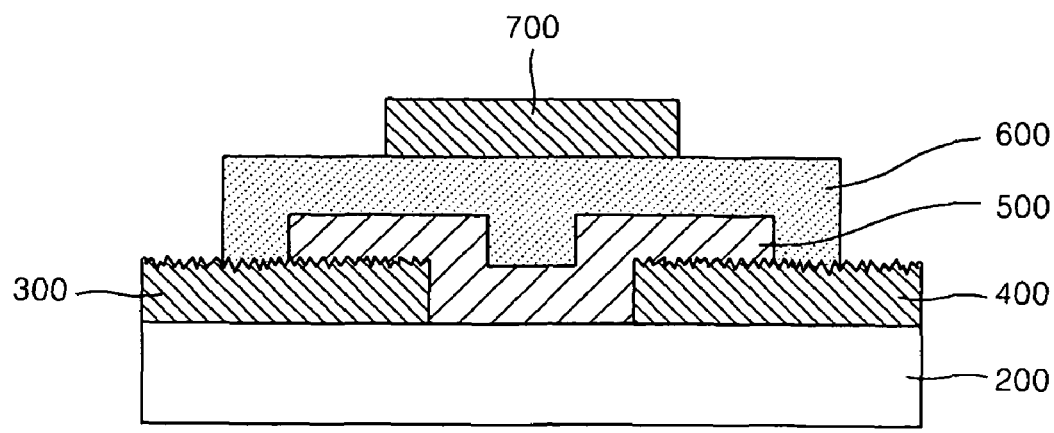
FIG. 12 is a cross-sectional view of an organic thin film transistor (OTFT) including a low impedance gold electrode, according to an embodiment of the present invention.

FIG. 12 is a cross-sectional view of an organic thin film transistor (OTFT) including a low impedance gold electrode, according to an embodiment of the present invention.

Referring to FIG. 12, the OTFT includes a substrate 200, a drain electrode 300 and a source electrode 400 disposed on the substrate 200, an active layer 500 disposed between the drain electrode 300 and the source electrode 400, an insulating layer 600 disposed on the active layer 500, and a gate electrode 700 disposed on the insulating layer 600.

A conventional OTFT often suffers from electrical property degradation due to poor contact between the active layer 500 and the drain and source electrodes 300 and 400. However, the OTFT of FIG. 12 includes gold electrodes, the surface roughness of each of which is increased through electrolysis, as the drain and source electrodes 300 and 400. Accordingly, a bonding force between the active layer 500 and the drain and source electrodes 300 and 400 can be improved in a similar manner of improving a poor contact with a solder ball as explained in FIGS. 10 and 11. The improvement in the bonding force between the active layer 500 and the drain and source electrodes 300 and 400 results from an increase in a surface roughness of each of the gold electrodes and an increase in contact area.

Although the gold electrode obtained by the electrolysis is applied to the OTFT having a staggered structure of FIG. 12, the present invention is not limited thereto, and the OTFT may have various other structures such as an inverted staggered structure, a coplanar structure, and an inverted coplanar structure. Also, the gold electrode obtained by the electrolysis according to the present invention can be used for other electrical and electronic devices by including the gold electrode of the present invention to thereby improve the bonding force between a component connected or bonded to the electrode surface. FIG. 13 provides an embodiment where the component is carbon nanotubes.

Figure 13A:
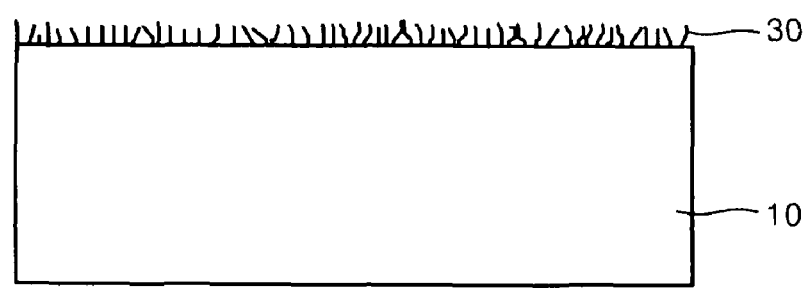
FIG. 13A is a cross-sectional view illustrating carbon nanotubes (CNTs) grown on a conventional gold electrode.

FIG. 13A is a cross-sectional view illustrating carbon nanotubes (CNTs) grown on a conventional gold electrode.

Referring to FIG. 13A, since a surface of the conventional gold electrode 10 is smooth, the number of CNTs 30 that can grow per unit area is limited. Accordingly, there is a demand for a method of growing a larger number of CNTs per unit area.

Figure 13B:
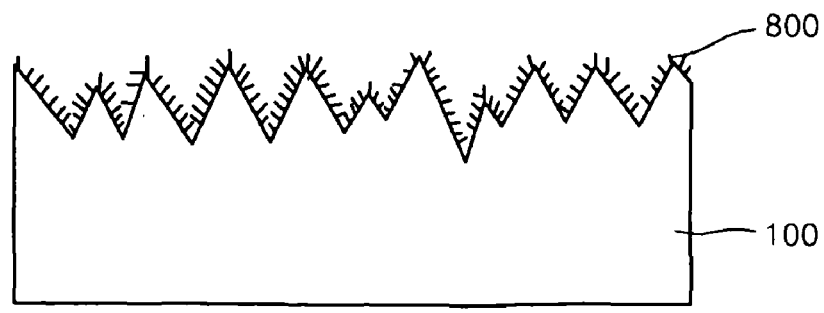
FIG. 13B is a cross-sectional view illustrating CNTs grown on a low impedance gold electrode according to the present invention.

FIG. 13B is a cross-sectional view illustrating CNTs grown on a low impedance gold electrode according to the present invention.

Referring to FIG. 13B, CNTs 800 grow on a gold electrode 100 whose surface roughness is increased through electrolysis. The surface area of the gold electrode is increased as the surface roughness is increased, and thus the number of CNTs that can grow per unit area can be greatly increased.

Although CNTs are shown in FIG. 13B as the component, the present invention is not limited thereto. That is, the gold electrode according to the present invention can be used to increase the number of substances or components capable of contacting the electrode surface. In an aspect, the invention provides a method for increasing the number of components in contact with a per unit area of material, such as a material that is a gold electrode surface, for example.

As described above, the low impedance gold electrode according to the present invention, whose surface roughness and surface area are increased through electrolysis, can significantly reduce an impedance, and the method of fabricating the low impedance gold electrode according to the present invention is inexpensive.

Furthermore, the low impedance gold electrode according to the present invention is not easily damaged by an external impact and thus can have good durability.

Moreover, the low impedance gold electrode according to the present invention can overcome poor contact problems, which often occur in conventional electrical and electronic devices, semiconductor devices and MEMSs, because of the increased surface roughness and bonding force with other materials.

In addition, the low impedance gold electrode according to the present invention can lead to an increase in the number of materials that can contact the low impedance gold electrode per unit area because of the increased surface roughness and corresponding increase in surface area available for contact. For example, the number of CNTs which can grow on the low impedance gold electrode per unit area can be increased.

While the present invention has been particularly shown and described with reference to exemplary embodiments thereof, it will be understood by one of ordinary skill in the art that various changes in form and details may be made therein without departing from the spirit and scope of the present invention as defined by the following claims.

When a Markush group or other grouping is used herein, all individual members of the group and all combinations and subcombinations possible of the group are intended to be individually included in the disclosure.

Every formulation or combination of components described or exemplified can be used to practice the invention, unless otherwise stated. Specific names of compounds are intended to be exemplary, as it is known that one of ordinary skill in the art can name the same compounds differently. One of ordinary skill in the art will appreciate that methods, device elements, starting materials, synthetic methods, other than those specifically exemplified can be employed in the practice of the invention without resort to undue experimentation. All art-known functional equivalents, of any such methods, device elements, starting materials, and synthetic methods are intended to be included in this invention. Whenever a range is given in the specification, for example, a voltage range, a time range, a composition range, or a size range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

In general the terms and phrases used herein have their art-recognized meaning, which can be found by reference to standard texts, journal references and contexts known to those skilled in the art

We claim:

1. A low impedance gold electrode comprising a single-layered structure having a surface roughness and an impedance greater than 0Ω when the electrode is inserted in an electrolyte solution, wherein said electrode is made by:
   electrolyzing a gold electrode surface in an acid electrolyte solution to increase the surface roughness of the gold electrode surface compared to the surface roughness before the electrolyzing step, wherein the electrolyzing step:
   decreases the electrode impedance to a value that is less than the impedance of the electrode before the electrolyzing step; and
   decreases the single-layered structure thickness to a value that is less than the thickness of the single-layered structure before the electrolyzing step.

2. The low impedance gold electrode of claim 1, having a root-mean-square surface roughness after the electrolyzing step selected from a range that is greater than or equal to 50 nm and less than or equal to 100 nm.

3. The low impedance gold electrode of claim 1, further comprising a component that is operably connected to a contact surface of said gold electrode, wherein said component is selected from the group consisting of:
   a solder ball for wire bonding; and
   a source or a drain electrode for an organic thin film transistor.

4. The low impedance gold electrode of claim 1, wherein the low impedance gold electrode is an electrode of a device component selected from the group consisting of:
   an electrode in a biosensor device; and
   a catalyst in an electrochemical reaction device.

5. An electrical and electronic device comprising the low impedance gold electrode of claim 1.

6. The electrical and electronic device of claim 5 further comprising:
   two electrodes; and
   an electrolyte solution disposed between the two electrodes,
wherein at least one of the two electrodes is the low impedance gold electrode.

7. The electrical and electronic device of claim 6, wherein the device is selected from the group consisting of a sensor, a cell, and an electrochemical reaction device.

8. The electrical and electronic device of claim 5, wherein the device is a semiconductor device or a micro electro mechanical system.

9. The electrical and electronic device of claim 5, wherein the device is a semiconductor device that is an organic thin film transistor, further comprising:
an active layer that is an organic semiconductor, wherein the active layer is bonded to the low impedance gold electrode.

10. The electrical and electronic device of claim 5, further comprising a solder ball bonded to the low impedance gold electrode.

11. The electrical and electronic device of claim 5, further comprising carbon nanotubes supported by the low impedance gold electrode.

12. The low impedance gold electrode of claim 1, wherein the electrode impedance decreases to a value that is less than or equal to 1/10 of the impedance of the electrode before the electrolyzing step.

13. An apparatus for fabricating a low impedance gold electrode, the apparatus comprising:
a 3-electrode system comprising a reference electrode to which a ground voltage is applied, a counter electrode to which a negative (−) voltage is applied, and a working electrode to which a positive (+) voltage is applied, or a 2-electrode electrode system comprising a cathode electrode to which a negative (−) voltage is applied and an anode electrode to which a positive (+) voltage is applied;
an acid electrolyte solution contacting the reference electrode and the counter electrode of the 3-electrode system or contacting the cathode electrode of the 2-electrode system; and
a gold thin film disposed in the acid electrolyte solution and in electrical contact with the working electrode or the anode electrode,
wherein a gold electrode is capable of being formed from the gold thin film when a voltage is applied to each of the electrodes.

14. The apparatus of claim 13, wherein:
the reference electrode is formed of a material selected from the group consisting of Ag/AgCl, calomel, and $Hg_2So_4$,
the counter electrode or the cathode electrode is formed of a transition metal, and
the working electrode or the anode electrode is formed of gold.

15. The apparatus of claim 13, wherein the acid electrolyte solution comprises a transition metal compound.

16. The apparatus of claim 15, wherein the electrolyte solution further comprises $H_2O$, $PtCl_6$, and $Pb(C_2H_3O_2)_2$.

* * * * *